United States Patent
Carmi

(10) Patent No.: US 7,992,293 B2
(45) Date of Patent: *Aug. 9, 2011

(54) METHOD OF MANUFACTURING A PATTERNED CONDUCTIVE LAYER

(75) Inventor: Yoash Carmi, Eilon (IL)

(73) Assignee: Hanita Coatings R.C.A. Ltd, Kibbutz Hanita (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/538,300

(22) Filed: Aug. 10, 2009

(65) Prior Publication Data

US 2009/0293268 A1    Dec. 3, 2009

Related U.S. Application Data

(63) Continuation-in-part of application No. 11/730,424, filed on Apr. 2, 2007, now Pat. No. 7,578,048.

(60) Provisional application No. 60/788,728, filed on Apr. 4, 2006.

(51) Int. Cl.
    *H05K 3/30* (2006.01)

(52) U.S. Cl. ............. 29/832; 29/592.1; 29/846; 29/847; 340/572.7; 343/700 R

(58) Field of Classification Search ............ 29/592.1, 29/601, 846, 847, 832; 340/572.7; 343/700 R
See application file for complete search history.

(56) References Cited

U.S. PATENT DOCUMENTS

| | | | |
|---|---|---|---|
| 4,822,451 A | 4/1989 | Ouderkirk et al. | |
| 4,879,176 A | 11/1989 | Ouderkirk et al. | |
| 4,968,390 A | 11/1990 | Bard et al. | |
| 5,216,254 A | 6/1993 | Ohta et al. | |
| 5,286,550 A | 2/1994 | Yu et al. | |
| 5,342,477 A * | 8/1994 | Cathey ................. 216/20 | |
| 5,389,195 A | 2/1995 | Ouderkirk et al. | |
| 6,037,005 A * | 3/2000 | Moshrefzadeh et al. ..... 427/286 | |
| 6,100,804 A | 8/2000 | Brady et al. | |
| 6,259,369 B1 | 7/2001 | Monico | |

(Continued)

FOREIGN PATENT DOCUMENTS

EP        0 834 915        4/1998

(Continued)

OTHER PUBLICATIONS

McClure et al., "A low-Cost Flexible Circuit on a Polyester Substrate", 1999 Society of Vacuum Coaters 505/856-7188, pp. 445-447, 42$^{nd}$ Annual Technical Conference Proceedings (Apr. 17-22, 1999), ISSN: 0737-5921.

(Continued)

*Primary Examiner* — C. J Arbes
(74) *Attorney, Agent, or Firm* — Pearl Cohen Zedek Latzer, LLP

(57) ABSTRACT

According to embodiments of the present invention, a method for manufacturing a pattern of conductive elements on a substrate is provided. The method includes applying a coating layer of electrically conductive transparent compounds onto a substrate; depositing in a vacuum deposition chamber an electrically conductive material onto the coating layer to form an electrically conductive layer; applying an etch-resist material on selective areas of the electrically conductive layer, wherein the selective areas are substantially areas pre-designed to carry the conductive objects; and chemically etching the electrically conductive material from exposed areas of the electrically conductive layer that are not covered by the etch-resist material.

19 Claims, 4 Drawing Sheets

U.S. PATENT DOCUMENTS

| | | |
|---|---|---|
| 7,260,882 B2 | 8/2007 | Credelle et al. |
| 7,578,048 B2 * | 8/2009 | Wollach et al. ............... 29/600 |
| 2006/0187056 A1 | 8/2006 | Carmi et al. |
| 2009/0165296 A1 | 7/2009 | Carmi |
| 2009/0239268 A1 * | 9/2009 | Okutani et al. ............ 435/108 |

FOREIGN PATENT DOCUMENTS

| | | |
|---|---|---|
| JP | 63282280 A | 11/1988 |
| KR | 2002 065756 | 8/2002 |

OTHER PUBLICATIONS

McClure et al., "Adhesion Promotion Technique for Coatings on PET, PEN and PI", 2000 Society of Vacuum Coaters 505/856-7188, pp. 342-346, $43^{rd}$ Annual Technical Conference Proceedings Apr. 15-20, 2000, (ISSN: 0737-5921).

Database WPI Week 200314, Derwent Publications Ltd., London, GB; AN: 2003-145024; XP-002480824.

* cited by examiner

METHOD OF MANUFACTURING A PATTERNED CONDUCTIVE LAYER

CROSS REFERENCE TO RELATED APPLICATIONS

The present application is a continuation-in-part application of patent application Ser. No. 11/730,424, filed Apr. 2, 2007 now U.S. Pat. No. 7,578,048, which claims benefit of U.S. Provisional Patent application Ser. No. 60/788,728, filed Apr. 4, 2006, both of which are incorporated by reference in their entirety.

BACKGROUND OF THE INVENTION

Many industrial applications involve laying down patterns of conductive material on a substrate to produce devices and flexible electronic circuits like, for example, bus bars and shunting lines for flat displays and lighting devices and transparent conductive electrodes (TCEs) for solar cells. A transparent conductive electrode, which may include a patterned grid of conductive material, enables transmission of visible light trough the grid. The average light transmission ratio may vary between 0.2% and 99.9% and for most cases enables substantial visibility through the grid. A conventional method of producing, for example, a grid on a flexible substrate is to chemically etch copper or aluminum foils laminated to polyester (PET) films. As the thickness of a standard copper film is between 18 microns and 35 microns and the thickness required for a typical antenna or a typical electrode is 11-15 microns, the etching process becomes very expensive and slow in addition to being not environmentally safe.

Another conventional method of producing TCE's involves printing the required patterns with conductive ink based on pastes containing a high concentration of electrically conductive particles (mainly silver). The printing process is expensive and not suitable for fine patterns. The low electrical conductivity of standard conductive inks is another drawback of this process. TCE's may be also produced by lamination of a metallic mesh to a substrate in a rather expensive and complicated process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
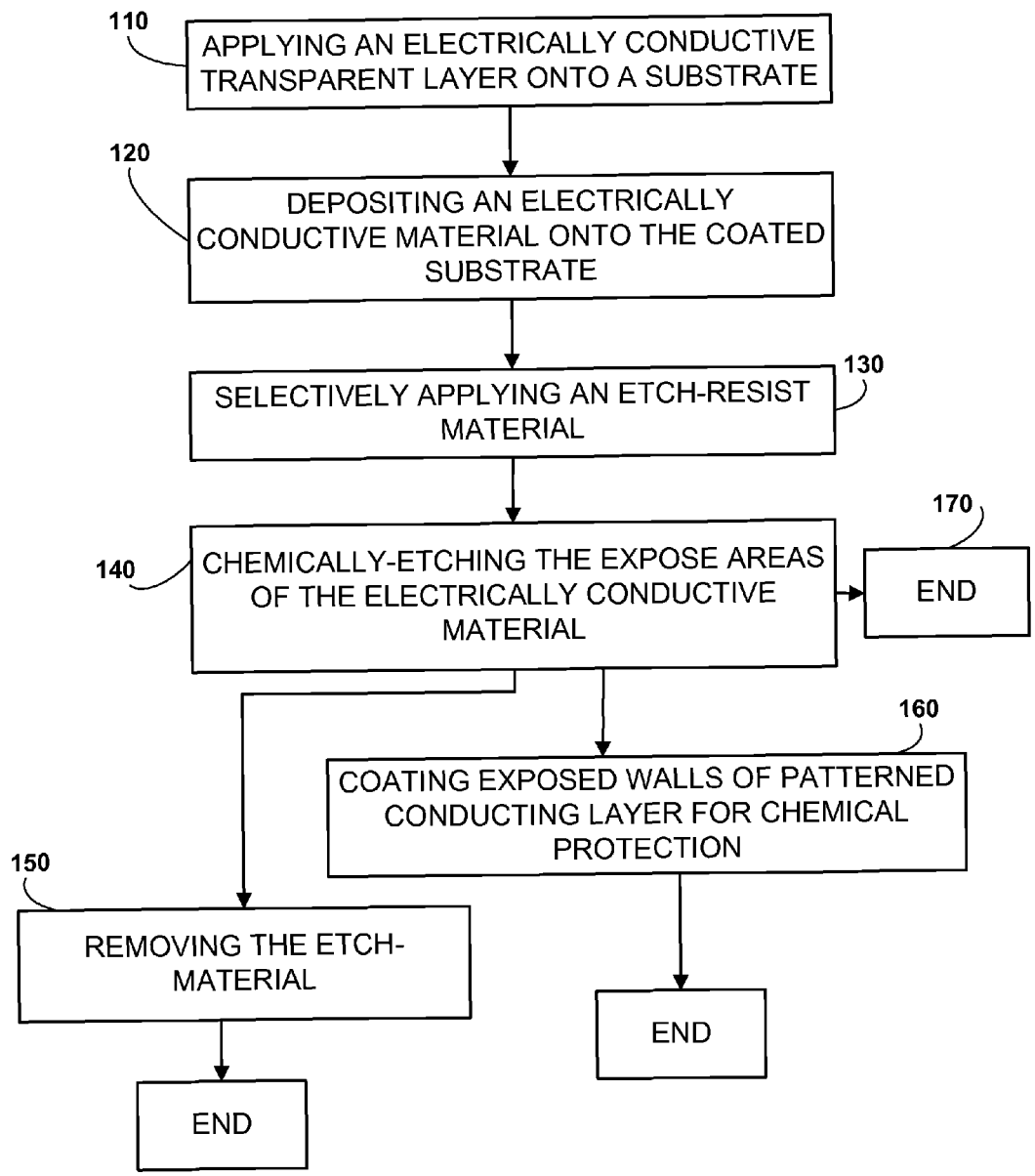
FIGS. 1-4 are flowchart illustrations of methods for manufacturing a pattern of conductive objects according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the embodiments of present invention may be practiced without these specific details. In other instances, well-known methods, procedures and components have not been described in detail so as not to obscure the present invention.

Embodiments of the present invention are directed to a method of producing a pattern of electrically conductive objects on a substrate. According to some embodiments of the present invention, the conductive objects may be flexible circuits. According to other embodiments of the present invention, the conductive objects may be metallic grids (mesh) useful for example as transparent conductive electrodes (TCEs) or heaters.

According to some embodiments of the invention, the method may include applying onto a substrate a coating layer that comprises electrically conductive transparent compounds. Then, depositing onto the substrate, in a vacuum chamber, an electrically conductive layer such as, for example copper. The conductive layer may be deposited in several paths. Next, according to embodiments of the invention, the method may include applying an etch resist material onto selective areas of the electrically conductive layer. The areas that are covered with the etch resist material may be the areas belonging to the desired conductive pattern. Next, the complementary areas not covered by the etch resist material may be removed using a chemical etching process and optionally the etch resist material may be removed from the substrate using any suitable process.

Although, in the description below, exemplary embodiments of methods of producing TCE grids are given, it should be understood to a person skilled in the art, that embodiments of the present invention may be used in a variety of other applications, such as, for example manufacturing of electromagnetic interference shields, transparent heaters, membranes, switches, flexible printed circuit boards, conductive panels and the like.

Reference is now made to FIG. 1, which is a flowchart diagram demonstrating methods for manufacturing an array of conductive objects according to embodiments of the present invention. The pattern of conductive objects may be, for example, a TCE grid.

Firstly, the method includes coating a substrate with an electrically conductive transparent coating layer (box 110). The coating layer may comprise electrically conductive transparent inorganic compounds, carbon nano-tube-based layers, conductive polymers or layers containing particles of transparent inorganic and conductive compounds. This process may be performed by sputtering or any other atmospheric coating process. Non-limiting examples of conducive polymers includes Polyaniline (PANI), Polyethylenedithiophene (PEDT) and Polyethylenedioxidethiophene (PEDOT) Non-limiting examples of conductive transparent inorganic compounds includes Indium Tin Oxide (ITO), Zinc oxide, Aluminum doped zinc oxide (AZO), Zinc doped Indium Oxide (IZO), Indium oxide and Flourinated tin oxide (FTO). Further, the transparent conductive coating may include carbon nano-tubes and lacquers that contain particles of conductive transparent inorganic compounds.

The substrate may be any substrate suitable for carrying an array of conductive objects, such as flexible transparent electrodes. The substrate may be a polymeric substrate such as, for example, a polyester (PET) film, a polypropylene (PP) film, a polyethylene (PE) film, PEI film, polyimide (PI) film, Ultem film, polyethylenenaphtalate (PEN) film, polycarbonate (PC) substrate and PVC substrate. Alternatively, the substrate may be from other materials such as, for example treated cardboard or treated paper. The substrate may be continuously wound in a form of a roll. Alternatively, sheets of substrate material may be used in the manufacturing process.

The array of conductive objects may be assembled using a roll-to-roll process. In these embodiments, a roll of substrate material may be unwound using a substrate-feed roller for depositing an electrically conductive layer onto the substrate. According to other embodiments of the present invention, the substrate-feed roller may be replaced by a sheet feeder mechanism and substrate 10 may be then in a form of substrate sheets.

Then, according to some embodiments of the present invention, the method includes depositing an electrically conductive layer onto the coated substrate (coated with the transparent layer) (box 120). According to some embodiments of the present invention, the method may include performing an in-vacuum metallization process by resistive vapor vacuum metallization. Alternatively, according to other embodiments of the present invention, the in-vacuum metallization process may be performed by inductive vacuum metallization, sputtering, electron beam gun or any other applicable physical vacuum deposition technique as known in the art.

The vapor vacuum metallization process may include transporting the substrate through a cloud of metallic vapor produced by continuous introduction of metallic wires to the surface of heated evaporation boats. When the hot metallic vapor meets the surface of the substrate, a thin metal layer is deposited onto the substrate. The metallic substance used for this process may be for example copper, aluminum, nickel, silver, stainless steel, tin and various metallic alloys, for example, bronze and brass or any combination of co-deposited metals.

According to other embodiments of the present invention, the method may include using wires of other electrically-conductive materials. Non-limiting examples of some non-metallic conductive materials are indium-oxide and indium tin oxide (ITO). Although, for clarity and simplification, the terms a "metal layer" and "metal deposition" are used, it should be understood to a person skilled in the art that embodiments of the present invention are likewise applicable to depositions of non-metallic conductive materials. Accordingly, it should be noted that throughout the specification, whenever the terms "a metal layer" or "metal deposition" are mentioned, equivalent description may apply to "an electrically-conductive layer" or "electrically-conductive material deposition".

The thickness of the deposition layer is typically 0.5 micron, although it may vary between 1 nanometer and 2 microns. For example, the final desired thickness in order to achieve an acceptable performance of transparent heaters for car window applications may be approximately 2-15 microns. The desired thickness for other applications may vary between 0.2 micron and 40 micron. Accordingly, the substrate should be further processed to achieve the desired thickness.

Optionally, according to embodiments of the present invention, prior to depositing the electrically-conductive layer, the method may include depositing a thin tie-layer onto the substrate to enhance the adhesion of the base layer to the substrate. This process may be performed by sputtering. Non-limiting examples of materials suitable to act as the tie-layer may be Nickel-Chromium, Chromium, Titanium and Inconel.

Next, the method may include selectively applying an etch-resist material onto the electrically conductive layer (box 130) according to a pre-determined pattern. Accordingly, the top surface of the coated substrate after this stage may include two defined areas, areas of etch-resist material, which are areas corresponding to the desired pattern and areas of electrically-conductive material to be removed in the etching stage. These areas are "complementary areas" to the desired pattern, which are coated with exposed electrically-conductive transparent material in the final product. Optionally, this process may be held in the vacuum chamber following in-line the previous vacuum deposition operation.

The term "etch-resist material" as used herein refers to materials resistant to chemical etching solutions. Non-limiting examples of etch-resist materials include Hydro chloric acid, Ammonium hydroxide and sodium per sulfate. such as, Nitric acid. These materials are capable to prevent, during the chemical etching process, removal or etching of materials covered by the etch-resist materials. An etch-resist material, as defined herein is resistant to etching solutions used for chemical etching, such as, nitric acid. Additionally, the etch-resist material, as defined herein is removable from an electrically-conductive layer, such as copper layer, without affecting the electrically conductive layer. According to embodiments of the invention, the method includes stripping off the etch-resist material from the electrically conductive material using basic solutions, such as KOH.

The process of selectively coating the substrate with the etch-resist material may be performed in various methods, such as, gravure printing, screen printing, inkjet printing and other applicable methods which may be used in a vacuum or an atmospheric environment. Alternatively, according to other embodiments of the present invention, the method may include performing UV lithography to selectively expose photo etching-resist materials after applying a layer of this material onto the entire top surface of the coated substrate. The lithography may include applying photoresist layer to the electrically conductive layer by any technique known in the art, such as, lamination or wet coating. Then, lithography may include applying a pre-designed mask onto the photoresist and illuminating the photoresist through a pre-designed mask with an electromagnetic radiation, such as an ultraviolet radiation. The illumination may cure the photo resist not covered by the mask on the complementary areas and the un-cured material, which was not exposed to the radiation, may be removed (negative photo resist). According to some embodiments of the invention, the method may include applying a positive photo resist layer where the mask is applied to the object areas and the complementary areas that are exposed to light are removed. Alternatively, an ultraviolet laser plotter may be used to cure the material on selective pre-designed areas.

According to embodiments of the invention, the method includes chemically etching the exposed portions of the electrically conductive layer to entirely remove the electrically conductive material from the complementary areas (box 140). The transparent coatings may stay substantially intact after the etching process.

According to embodiments of the invention the method may include removing the etch-resist material using any method known in the art, for example by applying a basic solution, such as NaOH, KOH or organic solvents (box 150).

Optionally, the method may include, without removal of the etch-resist material, depositing another metallic or non-metallic layer or layers on exposed areas of the conductive pattern, namely on the walls of the conductive objects exposed as a result of the etching process (box 160). The additional layer or layers may include silver (Ag), gold (Au), tin, Platinum (Pt), Palladium (Pd), Nickel (Ni), Copper (Co) or any combination thereof. These materials may be applied to the exposed areas of the conductive pattern by electroplating or electroless plating processes. The width of the layer may vary between 10 nanometer and 2 microns. The layer may serve as a chemically protective layer to eliminate or reduce corrosion.

In another embodiment, the etch-resist material may be removed after the etching process using any method known in the art, for example by applying a basic solution, such as NaOH, KOH or organic solvents to expose the top surface of the electrically conductive pattern (box 150).

According to embodiments of the invention, the etch resist material may not be removed and may remain on the final product to serve as an insulating and/or mechanical protection coating on top of the patterned conductive layer (box 170).

According to embodiments of the present invention, the etching stage may be the final stage of manufacture of the electrically conductive grid. Optionally, according to embodiments of the invention, the method includes further processing of the patterned electrically conductive substrate. For example the method may include a further process of plating the grid, in line or offline, adding a third layer on the second layer (the electroplated layer). The post-plating process may involve plating only the grid lines. The electrically conductive material used for the second electroplating process may be any electro-plateable material such as silver, gold, palladium, titanium, chromium, zinc, tin and platinum. It should be understood that metal alloy or combination of metal ions may be used as well. It should be understood to a person skilled in the art that the first and second metal layers may contain the same metal and may blend to form a single active layer. Alternatively, first metal and second metal layer may comprise different metals or alloys and accordingly may be distinguishable. Additional electroplated layer may be added with materials different of similar to the previous layers. According to some embodiments of the present invention, the additional electroplating processes may be performed prior to the etching stage.

For example, optionally, the method may include a further process of an additional chemical reaction with an added material or materials with the top surface of the grid lines to create specific required characteristics. A non-limiting example for such a chemical reaction involves passivation of the top layer by an oxidation reaction. The chemical reaction may produce a metal-oxide layer on a top surface of the second electrically conductive layer.

Figure 2:
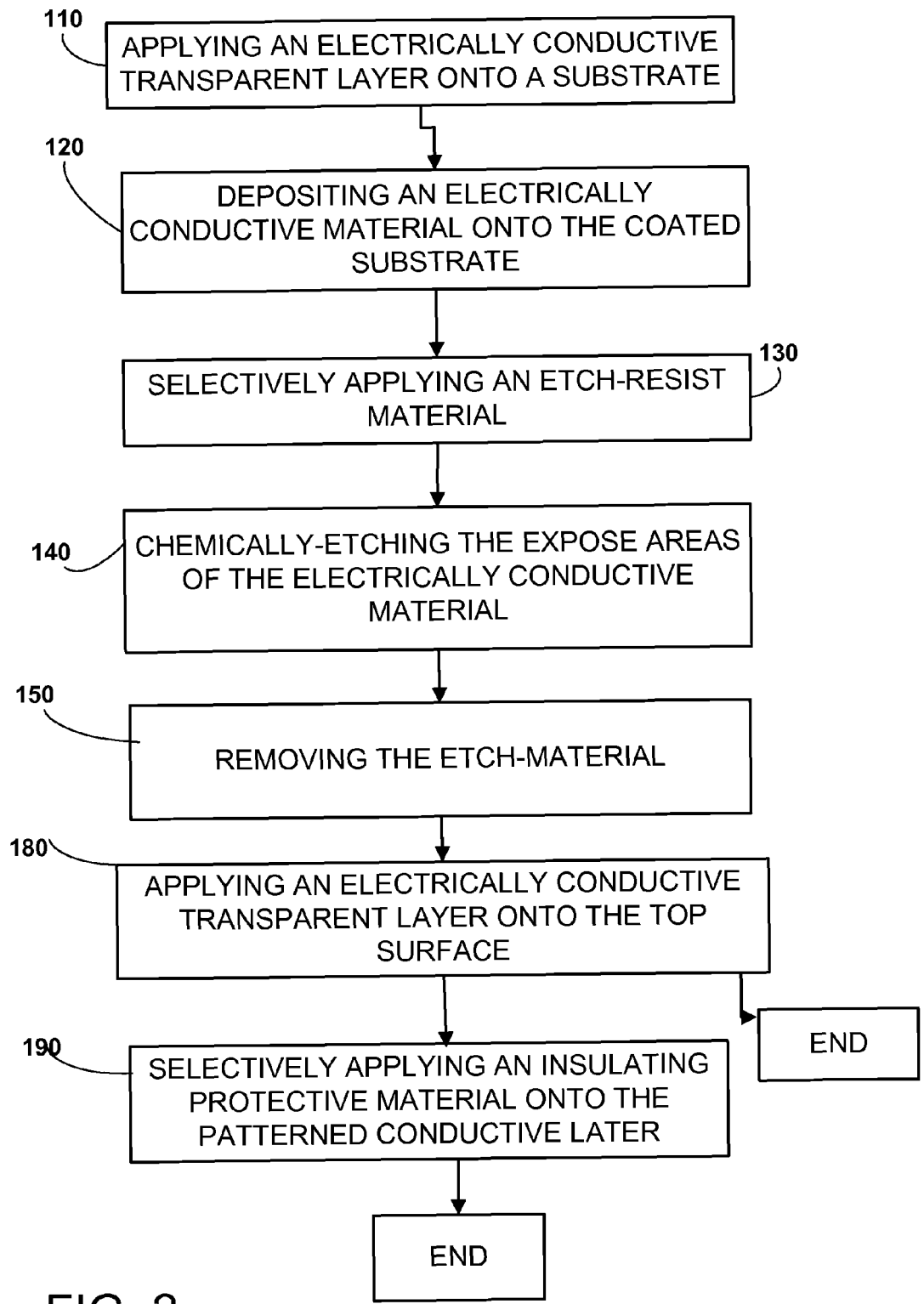

According to other embodiments of the invention, another post plating process may involve printing or otherwise applying an insulating material on a top surface of the grid lines. According to other embodiments of the present invention, another post plating process may involve applying onto the substrate a layer that includes conductive polymers. Yet, another post plating process may involve applying electrically conductive transparent inorganic compounds, such as, ITO onto the substrate. This process may be performed by sputtering Reference is now made to FIG. 2, which is a flowchart diagram demonstrating methods for manufacturing an array of conductive objects according to embodiments of the present invention. The first operations (box 110-150) are similar to the operations described with respect to FIG. 1. According to embodiments of the invention, after removal of the etch resist material, the entire surface may then be coated by a coating layer or layers of an electrically conductive transparent coating layer. The conductive transparent later may include conductive materials such as conductive polymers, carbon-nano-tubes-based coatings and others (box 180). Then, an additional coating or coatings may be applied selectively only above the top surface of patterned conductive layer to serve as an insulating and/or mechanical protection coating on top of the patterned conductive layer (box 190). The coating material for the protective layer may include UV or thermal curable inks.

Figure 3:
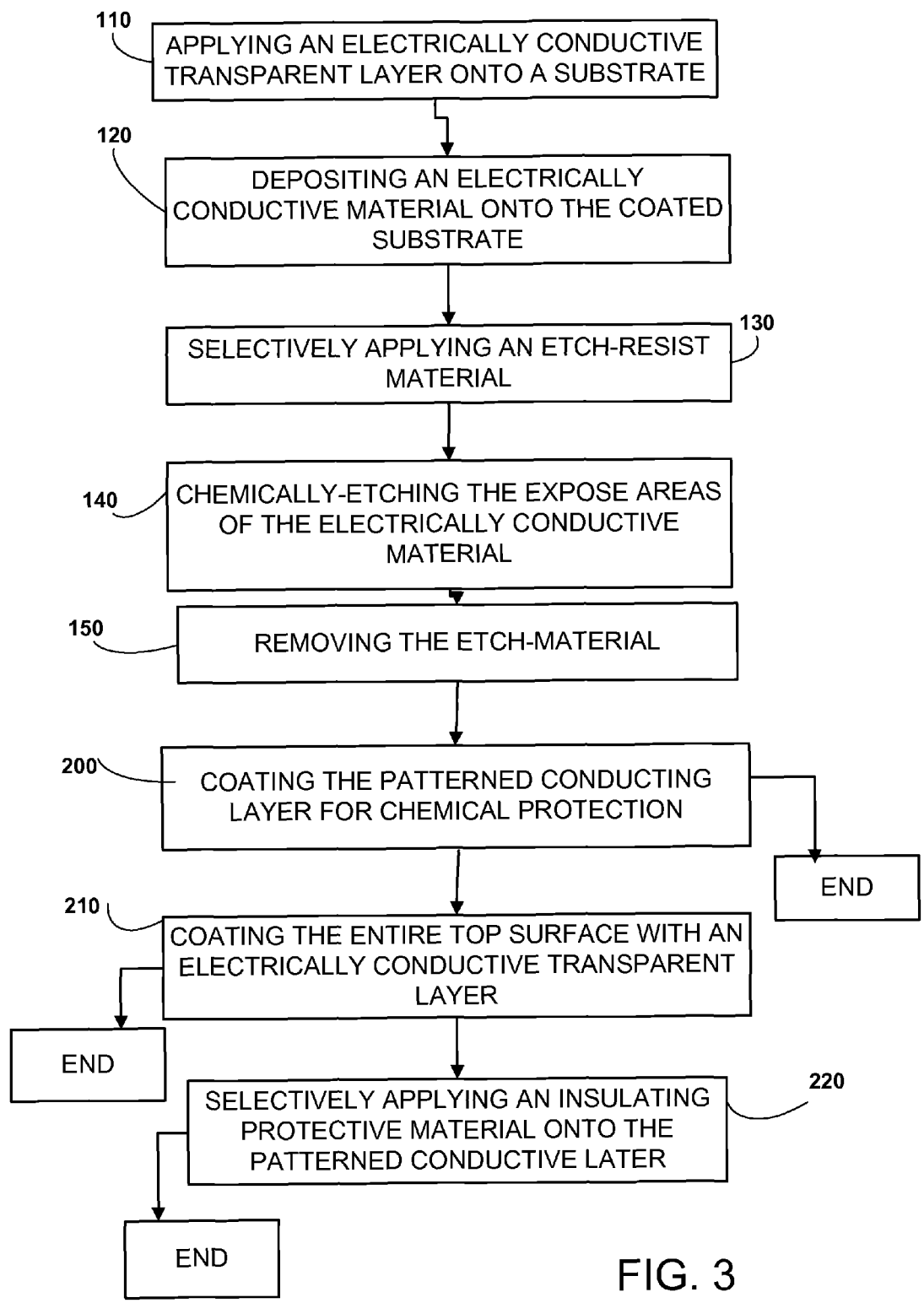

Reference is now made to FIG. 3, which is a flowchart diagram demonstrating methods for manufacturing an array of conductive objects according to embodiments of the present invention. The first operations (box 110-150) are similar to the operations described with respect to FIG. 1. According to embodiments of the invention, after removal of the etch resist material, the method may include depositing another metallic or non metallic layer or layers such as Ag, Au, tin, Pt, Pd or Ni, Co or combinations thereof on the conductive objects mainly for chemical protection (box 200). These materials may be applied to the exposed areas of the conductive pattern by electroplating or electroless plating processes.

According to some embodiments, the entire surface may then be coated by a coating layer or layers of an electrically conductive transparent coating layer. The conductive transparent later may include conductive materials such as conductive polymers, carbon-nano-tubes-based coatings and others (box 210). Then, an additional coating or coatings may be applied selectively only above the top surface of patterned conductive layer to serve as an insulating and/or mechanical protection coating on top of the patterned conductive layer (box 220). The coating material for the protective layer may include UV or thermal curable inks.

Figure 4:
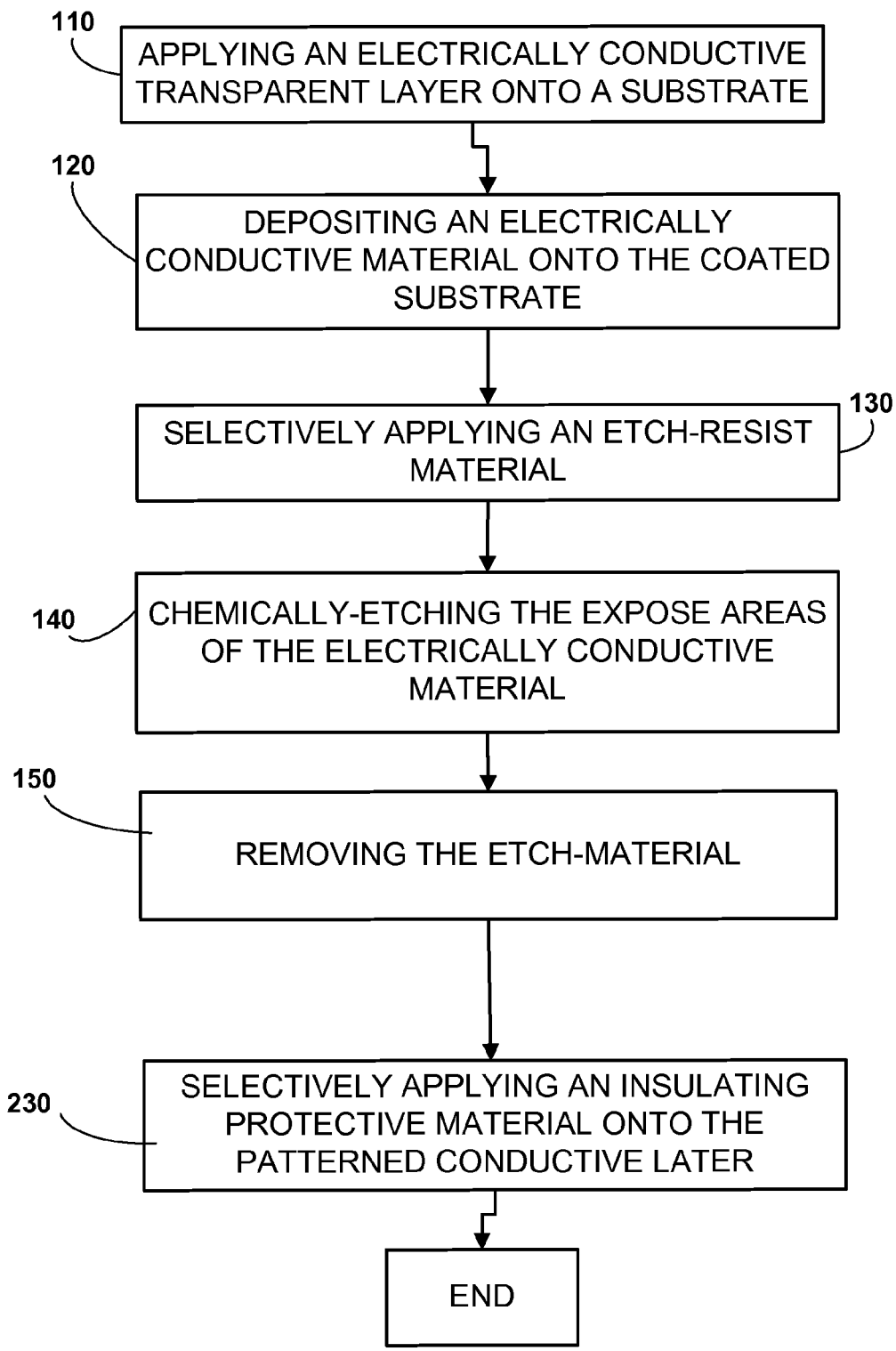

Reference is now made to FIG. 4, which is a flowchart diagram demonstrating methods for manufacturing an array of conductive objects according to embodiments of the present invention. The first operations (box 110-150) are similar to the operations described with respect to FIG. 1. According to embodiments of the invention, after removal of the etch resist material, the method may include selectively applying a coating layer directly above the patterned conductive layer to serve as an insulating and/or mechanical protection coating on top of the patterned conductive layer (box 230).

It is appreciated that one or more of the steps of any of the methods described herein may be omitted or carried out in a different order than that shown, without departing from the true spirit and scope of the invention.

While the present invention has been described with reference to one or more specific embodiments, and mainly to embodiments describing the manufacturing of metallic grids, the description is intended to be illustrative of the invention as a whole, and is not to be construed as limiting the invention to the embodiments shown. As explained above, it should be understood to a person skilled in the art that embodiments of the present invention may be used for the manufacturing of conductive objects related to flexible electronics, such as, for example, displays, lighting devices, transparent heaters, solar cells, membrane switches, flexible printed circuit boards, conductive panels and the like.

It is appreciated that various modifications may occur to those skilled in the art that, while not specifically shown herein, are nevertheless within the true spirit and scope of the invention.

What is claimed is:

1. A method for manufacturing a patterned electrically-conductive layer of conductive objects on a substrate, the method comprising:
    applying a coating layer onto a substrate, wherein the coating layer comprises electrically-conductive transparent compounds;

depositing in a vacuum deposition chamber an electrically-conductive material onto the coating layer to form an electrically-conductive layer;

applying an etch-resist material on selective areas of the electrically-conductive layer, wherein the selective areas are substantially areas pre-designed to carry the conductive objects; and chemically etching the electrically-conductive material from exposed areas of the electrically-conductive layer that are not covered by the etch-resist material.

2. The method of claim 1 further comprising:
coating exposed portions of the electrically-conductive layer with a metallic layer or layers by electroplating of electroless processes.

3. The method of claim 1 further comprising:
coating exposed portions of the electrically-conductive layer with a non metallic layer or layers by electroplating of electroless processes.

4. The method of claim 1 further comprising:
removing the etch-resist material to expose a top surface of the patterned electrically-conductive layer.

5. The method of claim 4 further comprising:
coating the patterned electrically-conductive layer with a metallic layer by electroplating of electroless processes.

6. The method of claim 4 further comprising:
coating the patterned electrically-conductive layer with a non metallic layer by electroplating of electroless processes.

7. The method of claim 5 further comprising:
selectively applying an electrically-insulating coating layer on the top surface of the patterned conductive layer.

8. The method of claim 5 further comprising:
applying an additional coating layer on the entire top surface, wherein the additional coating layer comprises electrically-conductive transparent compounds;
selectively applying an insulating coating layer onto additional coating layer only above the patterned conductive layer.

9. The method of claim 1, wherein the etch-resist material remains on top of the patterned conductive layer as a protective coating layer.

10. The method of claim 1 further comprising:
removing the etch-resist material to expose the patterned electrically-conductive layer;
selectively applying an insulating coating layer on top of the patterned conductive layer after removal of the etch-resist material.

11. The method of claim 1 further comprising:
removing the etch-resist material to expose the patterned electrically-conductive layer
applying an additional coating layer on the entire top surface, wherein the additional coating layer comprises electrically-conductive transparent compounds;
selectively applying an insulating coating layer onto additional coating layer only above the patterned conductive layer.

12. The method of claim 1 further comprising:
performing an oxidation reaction after removal of the etch-resist material to produce a metal-oxide layer.

13. The method of claim 1, wherein the pattern of conductive objects being a grid of transparent electrodes.

14. The method of claim 1, wherein depositing the electrically-conductive material is done by a process of resistive vacuum metallization, inductive vacuum metallization sputtering or electron beam gun deposition.

15. The method of claim 1, wherein the pattern of conductive objects forms flexible electronic circuits, transparent conductive electrodes, electric shunting lines, heaters or electromagnetic interference shields.

16. The method of claim 1, wherein depositing the electrically conductive material comprises depositing copper, aluminum, nickel, silver, stainless steel, tin, metallic alloy deposition or co-deposition of metals or metallic alloys.

17. The method of claim 1 wherein the conductive transparent compounds are inorganic compounds, lacquers containing inorganic particles or conductive polymers.

18. The method of claim 1, wherein the electrically conductive transparent compounds include indium tin oxide, zinc oxide, aluminum doped zinc oxide, zinc doped indium oxide, indium oxide, fluorinated tin oxide and any combination thereof.

19. The method of claim 1, wherein the conductive transparent compounds include Polyaniline (PANI), Polyethylenedithiophene (PEDT), Polyethylenedioxidethiophene (PEDOT) or any derivatives or combination thereof.

* * * * *